(12) United States Patent
Deng et al.

(10) Patent No.: US 9,491,850 B2
(45) Date of Patent: Nov. 8, 2016

(54) PRINTED CIRCUIT BOARD

(71) Applicants: HONG FU JIN PRECISION INDUSTRY (WuHan) CO., LTD., Wuhan (CN); HON HAI PRECISION INDUSTRY CO., LTD., New Taipei (TW)

(72) Inventors: Feng-Hua Deng, Wuhan (CN); Feng Zhang, Wuhan (CN)

(73) Assignees: HONG FU JIN PRECISION INDUSTRY (WuHan) CO., LTD., Wuhan (CN); HON HAI PRECISION INDUSTRY CO., LTD., New Taipei (TW)

( * ) Notice: Subject to any disclaimer, the term of this patent is extended or adjusted under 35 U.S.C. 154(b) by 5 days.

(21) Appl. No.: 14/550,535

(22) Filed: Nov. 21, 2014

(65) Prior Publication Data

US 2015/0237715 A1 Aug. 20, 2015

(30) Foreign Application Priority Data

Feb. 18, 2014 (CN) .......................... 2014 1 0054486

(51) Int. Cl.
H05K 1/02 (2006.01)
H05K 1/11 (2006.01)

(52) U.S. Cl.
CPC ........... *H05K 1/0251* (2013.01); *H05K 1/0225* (2013.01); *H05K 1/113* (2013.01)

(58) Field of Classification Search
CPC ............................. H05K 1/115; H05K 1/116
See application file for complete search history.

(56) References Cited

U.S. PATENT DOCUMENTS 8,035,992 B2 * 10/2011 Kushta .............. H01L 23/49827
174/262

* cited by examiner

Primary Examiner — Jeremy C Norris
(74) Attorney, Agent, or Firm — Zhigang Ma

(57) ABSTRACT

A printed circuit board includes a first dielectric layer, a first ground layer, a second dielectric layer, a first power layer, a first via hole and a ground hole extending through the printed circuit board. A first signal line is laid on the first dielectric layer. A third signal line is laid on the second dielectric layer. The first and third signal lines are electrically connected to the first via hole. An extending direction of the first signal line on the first dielectric layer is the same as an extending direction of the third signal line is laid on the second dielectric layer. A first void area is defined in the first ground layer around the first via hole. A second void area is defined in the first power layer around the first via hole. The ground hole is outside the first void area and the second void area.

20 Claims, 3 Drawing Sheets

PRINTED CIRCUIT BOARD

CROSS-REFERENCE TO RELATED APPLICATIONS

This application claims priority to Chinese Patent Application No. 201410054486.7 filed on Feb. 18, 2014 in the China Intellectual Property Office, the contents of which are incorporated by reference herein.

FIELD

The subject matter herein generally relates to a printed circuit board.

BACKGROUND

A signal integrity is important when layout in printed circuit boards. To ensure the signal integrity of the printed circuit boards, an impedance matching and a continuity of signal lines in the printed circuit boards are foremost.

BRIEF DESCRIPTION OF THE DRAWINGS

Implementations of the present technology will now be described, by way of example only, with reference to the attached figures.

DETAILED DESCRIPTION

Figure 1:
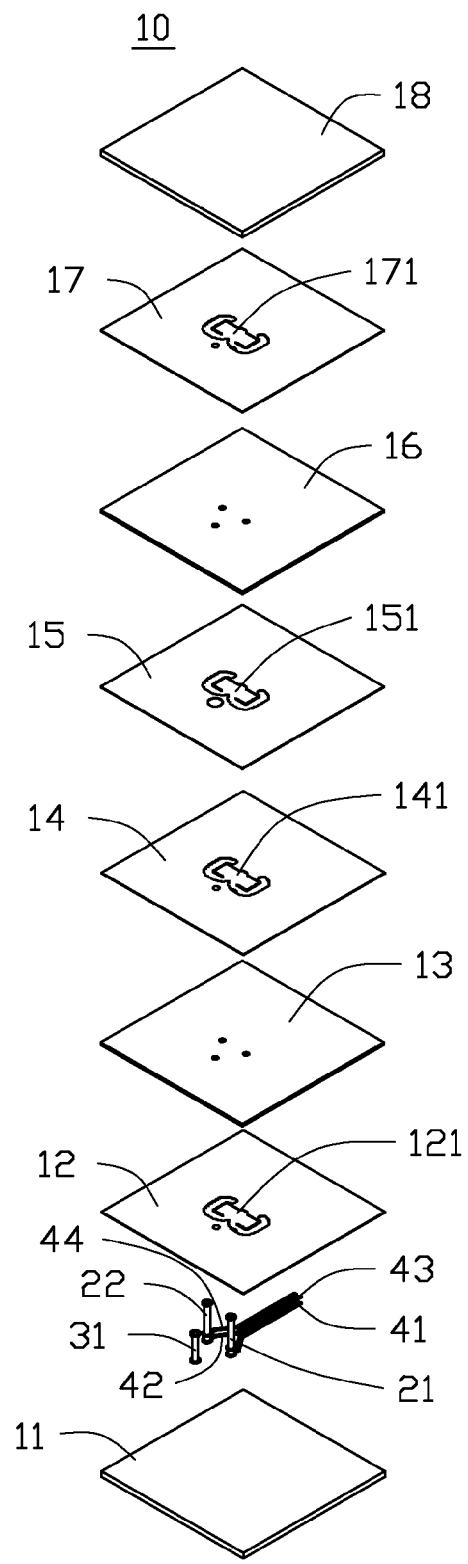
FIG. 1 is an exploded, isometric view of an embodiment of a printed circuit board.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising," when utilized, means "including, but not necessarily limited to"; it specifically indicates open-ended inclusion or membership in the so-described combination, group, series and the like.

FIG. 1 illustrates a printed circuit board 10 in accordance with an embodiment. The printed circuit board 10 includes a first dielectric layer 11, a first ground layer 12, a second dielectric layer 13, a first power layer 14, a second power layer 15, a third dielectric layer 16, a second ground layer 17, and a fourth dielectric layer 18 arranged from bottom to top. The printed circuit board 10 defines a first via hole 21, a second via hole 22, and a ground hole 31. A metallic material is smeared in inner surfaces of each of the first via hole 21, the second via hole 22, and the ground hole 31.

The first ground layer 12 defines a first void area 121 surrounding the first via hole 21 and the second via hole 22. The ground hole 31 is located outside the first void area 121. The first power layer 14 defines a second void area 141 surrounding the first via hole 21 and the second via hole 22. The ground hole 31 is located outside the second void area 141. Each of the first ground layer 12 and the first power layer 14 is a metallic layer. In at least one embodiment, each of the first void area 121 and the second void area 141 is substantially "E" shaped.

The second power layer 15 defines a third void area 151 surrounding the first via hole 21 and the second via hole 22. The ground hole 31 is located outside the third void area 151. The second ground layer 17 defines a fourth void area 171 surrounding the first via hole 21 and the second via hole 22. The ground hole 31 is located outside the fourth void area 171. Each of the second power layer 15 and the second ground layer 17 is a metallic layer. Each of the third void area 151 and the fourth void area 171 has a same shape as the first void area 121 and the second void area 141.

Figure 2:
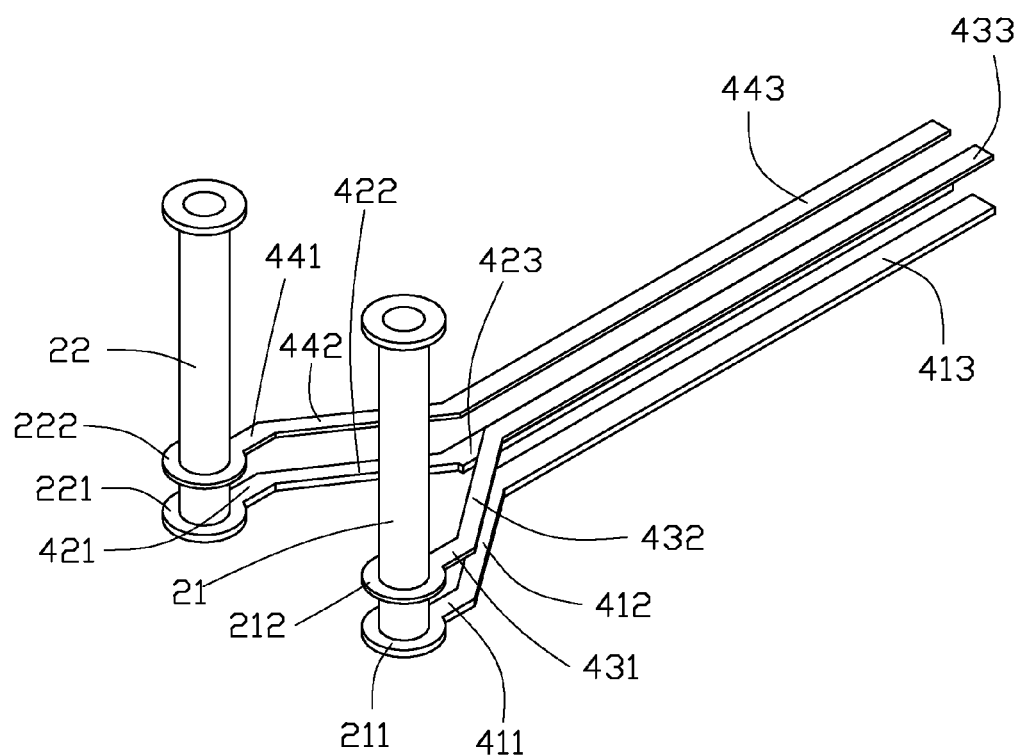
FIG. 2 is an assembled, isometric view of a first via hole, a second via hole, a first signal line, a second signal, a third signal, and a fourth signal line of the printed circuit board of FIG. 1.

FIG. 1 and FIG. 2 illustrate a first signal line 41 and a second signal line 42 laid in the first dielectric layer 11. A third signal line 43 and a fourth signal line 44 are laid in the second dielectric layer 13. The first signal line 41 and the third signal line 43 are electronically coupled to the first via hole 21. The second signal line 42 and the fourth signal line 44 are electronically coupled to the second via hole 22. An extending direction of the first signal line 41 is the same as an extending direction of the third signal line 43.

A first bonding pad 211 is located on the first dielectric layer 11 and coupled to the inner surfaces of the first via hole 21. A second bonding pad 221 is located on the first dielectric layer 11 and coupled to the inner surfaces of the second via hole 22. A third bonding pad 212 is located on the second dielectric layer 13 and coupled to the inner surfaces of the first via hole 21. A fourth bonding pad 222 is located on the second dielectric layer 13 and coupled to the inner surfaces of the second via hole 22.

The first signal line 41 includes a first segment 411, a second segment 412, and a third segment 413. The first segment 411 is electronically coupled to the first bonding pad 211. An obtuse angle is defined between the second segment 412 and each of the first segment 411 and the third segment 413. The second signal line 42 includes a fourth segment 421, a fifth segment 422, and a sixth segment 423. The fourth segment 421 is electronically coupled to the second bonding pad 221. An obtuse angle is defined between the fifth segment 422 and each of the fourth segment 421 and the sixth segment 423. The first segment 411 is substantially parallel to the fourth segment 421, the second segment 412 is substantially parallel to the fifth segment 422, and the third segment 413 is substantially parallel to the sixth segment 423. The first signal line 41 is coplanar with the second signal line 42.

The ninth signal line 43 includes a seventh segment 431, an eighth segment 432, and a ninth segment 433. The seventh segment 431 is electronically coupled to the third bonding pad 212. An obtuse angle is defined between the eighth segment 432 and each of the seventh segment 431 and the ninth segment 433. The fourth signal line 44 includes a tenth segment 441, an eleventh segment 442, and a twelfth segment 443. The tenth segment 441 is electronically coupled to the fourth bonding pad 222. An obtuse angle is defined between the eleventh segment 442 and each of the tenth segment 441 and the twelfth segment 443. The seventh segment 431 is substantially parallel to the tenth segment 441, the eighth segment 432 is substantially parallel to the eleventh segment 442, and the ninth segment 433 is substantially parallel to the twelfth segment 443. The third signal line 43 is coplanar with the fourth signal line 44.

The first segment 411 is substantially parallel to the fourth segment 421. The third segment 413 is substantially parallel to the sixth segment 423. A distance between the first segment 411 and the fourth segment 421 is greater than a distance between the third segment 413 and the sixth segment 423. The seventh segment 431 is substantially parallel to the tenth segment 441. The ninth segment 433 is substantially parallel to the twelfth segment 443. A distance between the seventh segment 431 and the tenth segment 441 is greater than a distance between the ninth segment 433 and the twelfth segment 443.

Because each metallic layer defines a void area, such as the first void area 121, the second void area 141, the third void area 151, and the fourth void area 171, permittivity of the first via hole 21 and the second via hole 22 are changed. At the same time, a metallic reference plane of the first via hole 21 and the second via hole 22 is changed, causing a reference distance from each of the first via hole 21 and the second via hole 22 to the reference plane is changed. The changes of the permittivity and the reference distance cause an impedance of the first via hole 21 and the second via hole 22 to be changed.

Figure 3:
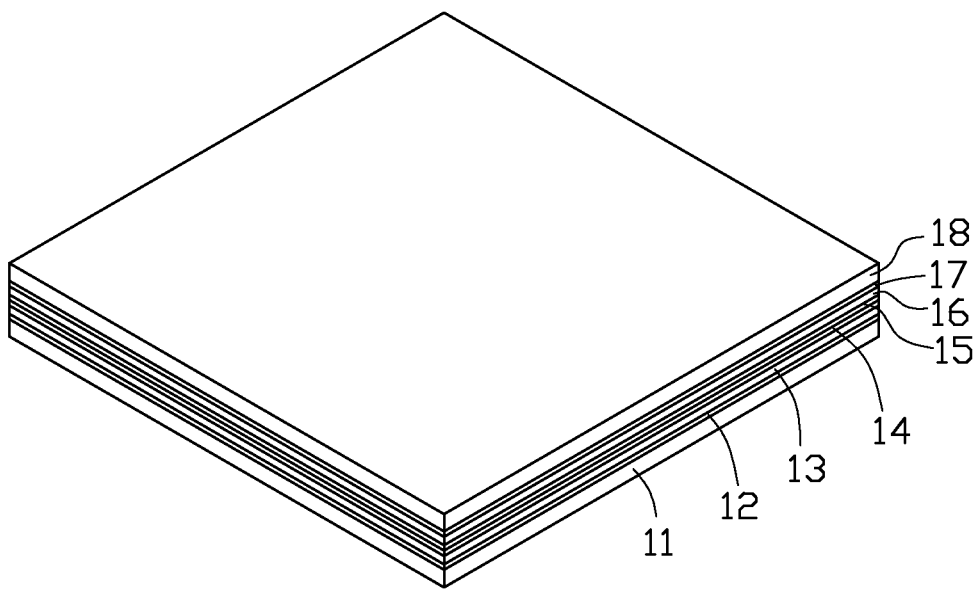
FIG. 3 is an assembled, isometric view of the printed circuit board of FIG. 1.

Referring to FIGS. 1-3, a time domain reflector (not shown) is used to simulate the impedances of the first via hole 21, the second via hole 22, the first signal line 41, the second signal line 42, the third signal line 43, and the fourth signal line 44. When using the printed circuit board 10, a first impedance of the first signal line 41, the second signal line 42, the third signal line 43, and the fourth signal line 44 is 93.5 ohm, and a second impedance of the first via hole 21 and the second via hole 22 is 87.5 ohm. When testing other printed circuit boards, the first impedance is generally 89 ohm, and the second impedance is generally 69 ohm.

Thus, the second impedance in the current applicant is increased to better match the first impedance better.

The embodiments shown and described above are only examples. Many details are often found in the art such as the other features of a printed circuit board. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including the full extent established by the broad general meaning of the terms used in the claims. It will therefore be appreciated that the embodiments described above may be modified within the scope of the claims.

What is claimed is:

1. A printed circuit board, comprising:
   a first dielectric layer with a first signal line laid thereon;
   a first ground layer;
   a second dielectric layer with a third signal line laid thereon;
   a first power layer;
   a first via hole extending through the first dielectric layer, the first ground layer, the second dielectric layer, and the first power layer; and
   a ground hole,
   wherein the first signal line and the third signal line are electrically connected to the first via hole, and an extending direction of the first signal line from the first via hole is the same as an extending direction of the third signal line from the first via hole;
   a first void area is defined in the first ground layer around the first via hole, and a second void area is defined in the first power layer around the first via hole; and
   the ground hole is outside the first void area and the second void area.

2. The printed circuit board of claim 1, further comprising a first bonding pad located on the first dielectric layer, wherein the first signal line comprises a first segment, a second segment, and a third segment, the first bonding pad is electronically coupled to inner surfaces of the first via hole, and the first segment is electronically coupled to the first bonding pad.

3. The printed circuit board of claim 2, further comprising a second via hole, a second signal line, and a fourth signal line, wherein the second signal line is laid on the first dielectric layer, the fourth signal line is laid on the second dielectric layer, each of the second signal line and the fourth signal line is electronically coupled to the second via hole.

4. The printed circuit board of claim 3, further comprising a second bonding pad located on the first dielectric layer and electronically coupled to the second via hole, wherein the second signal line comprises a fourth segment, a fifth segment, and a sixth segment, and the fourth segment is electronically coupled to the second bonding pad.

5. The printed circuit board of claim 4, wherein the second segment is coupled between the first segment and the third segment, and an obtuse angle is defined between the second segment and each of the first segment and the third segment; and the fifth segment is coupled between the fourth segment and the six segment, and an obtuse angle is defined between the fifth segment and each of the fourth segment and the sixth segment.

6. The printed circuit board of claim 4, wherein a straight line is defined by connecting the first via hole and the second via hole, the first segment is parallel to the fourth segment and extends towards a same side of the straight line as the fourth segment, the third segment is parallel to the sixth segment, and a distance between the first segment and the fourth segment is greater than a distance between the third segment and the sixth segment.

7. The printed circuit board of claim 3, wherein the first signal line is coplanar to the second signal line at a first plane, the third signal line is coplanar to the fourth signal line at a second plane, and the first plane is parallel to the second plane.

8. The printed circuit board of claim 3, further comprising a second power layer, a third dielectric layer, a second ground layer, and a fourth dielectric layer, wherein the second power layer defines a third void area around the first via hole and the second via hole, and the ground hole is outside the third void area.

9. The printed circuit board of claim 8, wherein the second ground layer defines a fourth void area around the first via hole and the second via hole, and the ground hole is outside the fourth void area.

10. The printed circuit board of claim 3, wherein the first signal line is substantially parallel to the third signal line, and the second signal line is substantially parallel to the fourth signal line.

11. A printed circuit board comprising:
a first dielectric layer with a first signal line laid thereon;
a first ground layer;
a second dielectric layer with a third signal line laid thereon;
a first power layer;
a first via hole and a second via hole extending through the first dielectric layer, the first ground layer, the second dielectric layer, and the first power layer;
a ground hole; and
a first bonding pad located on the first dielectric layer and electronically coupled to inner surfaces of the first via hole,
wherein the first signal line is electrically coupled to the first bonding pad, the third signal line is substantially parallel to the first signal line and electrically coupled to the first via hole, and an extending direction of the first signal line is the same as an extending direction of the third signal line;
a first void area is defined in the first ground layer around the first via hole, and a second void area is defined in the first power layer around the first via hole; and
the ground hole is outside the first void area and the second void area;
wherein each of the first void area and the second void area is substantially "∈" shaped and cooperatively defined by a plurality of consecutive circular holes.

12. The printed circuit board of claim 11, wherein the first signal line comprises a first segment, a second segment, and a third segment, and the first segment is electronically coupled to the first bonding pad.

13. The printed circuit board of claim 12, further comprising a second signal line and a fourth signal line, wherein the second signal line is laid on the first dielectric layer, the fourth signal line is laid on the second dielectric layer, each of the second signal line and the fourth signal line is electronically coupled to the second via hole.

14. The printed circuit board of claim 13, further comprising a second bonding pad located on the first dielectric layer and electronically coupled to the second via hole, wherein the second signal line comprises a fourth segment, a fifth segment, and a sixth segment, and the fourth segment is electronically coupled to the second bonding pad.

15. The printed circuit board of claim 14, wherein the second segment is coupled between the first segment and the third segment, and an obtuse angle is defined between the second segment and each of the first segment and the third segment; and the fifth segment is coupled between the fourth segment and the six segment, and an obtuse angle is defined between the fifth segment and each of the fourth segment and the sixth segment.

16. The printed circuit board of claim 14, wherein a straight line is defined by connecting the first via hole and the second via hole, the first segment is parallel to the fourth segment and extends towards a same side of the straight line as the fourth segment, the third segment is parallel to the sixth segment, and a distance between the first segment and the fourth segment is greater than a distance between the third segment and the sixth segment.

17. The printed circuit board of claim 13, wherein the first signal line is coplanar to the second signal line at a first plane, the third signal line is coplanar to the fourth signal line at a second plane, and the first plane is parallel to the second plane.

18. The printed circuit board of claim 13, further comprising a second power layer, a third dielectric layer, a second ground layer, and a fourth dielectric layer, wherein the second power layer defines a third void area around the first via hole and the second via hole, and the ground hole is outside the third void area.

19. The printed circuit board of claim 18, wherein the second ground layer defines a fourth void area around the first via hole and the second via hole, and the ground hole is outside the fourth void area.

20. The printed circuit board of claim 13, wherein the second signal line is substantially parallel to the fourth signal line.

* * * * *